(12) United States Patent
Kwon et al.

(10) Patent No.: US 10,083,774 B2
(45) Date of Patent: Sep. 25, 2018

(54) ENCAPSULATED QUANTUM DOTS AND DEVICE USING SAME

(71) Applicant: LMS Co., Ltd., Pyeongtaek-si (KR)

(72) Inventors: Doo Hyo Kwon, Anyang-si (KR); Jeong Og Choi, Seoul (KR); Oh Kwan Kwon, Anyang-si (KR)

(73) Assignee: LMS Co., Ltd., Pyeongtaek-si (KR)

( * ) Notice: Subject to any disclaimer, the term of this patent is extended or adjusted under 35 U.S.C. 154(b) by 333 days.

(21) Appl. No.: 14/412,240

(22) PCT Filed: Jul. 3, 2013

(86) PCT No.: PCT/KR2013/005887
§ 371 (c)(1),
(2) Date: Dec. 31, 2014

(87) PCT Pub. No.: WO2014/007532
PCT Pub. Date: Jan. 9, 2014

(65) Prior Publication Data
US 2015/0184066 A1    Jul. 2, 2015

(30) Foreign Application Priority Data
Jul. 3, 2012 (KR) .................. 10-2012-0072217

(51) Int. Cl.
*H01B 1/06* (2006.01)
*H01B 1/08* (2006.01)
(Continued)

(52) U.S. Cl.
CPC ............... *H01B 1/06* (2013.01); *B82Y 10/00* (2013.01); *C08J 5/18* (2013.01); *C08K 5/5415* (2013.01);
(Continued)

(58) Field of Classification Search
CPC ... H01B 1/06; H01B 1/08; H01B 1/10; H01B 1/20; C09K 11/02; C09K 11/025;
(Continued)

(56) References Cited

U.S. PATENT DOCUMENTS

| 6,869,864 B2 * | 3/2005 | Yim ...................... B82Y 20/00 438/478 |
| 7,235,190 B1 * | 6/2007 | Wilcoxon ............... C09K 11/02 252/301.6 S |

(Continued)

FOREIGN PATENT DOCUMENTS

| EP | 2034002 A2 * | 3/2009 | ............ B82Y 30/00 |
| KR | 1020050003548 B1 | 1/2005 | |

(Continued)

OTHER PUBLICATIONS

Bond, Chemical. Hawley's Condensed Chemical Dictionary. 171-172 (2007).*

*Primary Examiner* — Harold Y Pyon
*Assistant Examiner* — Matthew R Diaz
(74) *Attorney, Agent, or Firm* — The Webb Law Firm

(57) ABSTRACT

The present invention provides a quantum dot encapsulated by a siloxane including an alkyl group having 4 or more carbon atoms, a composition including the same, and a device to which the composition is applied, and when the encapsulated quantum dot is used, quantum yield and dispersion stability may be enhanced.

14 Claims, 2 Drawing Sheets

(51) Int. Cl.
| | |
|---|---|
| *H01B 1/10* | (2006.01) |
| *C08K 5/5415* | (2006.01) |
| *C09C 3/12* | (2006.01) |
| *C09D 5/22* | (2006.01) |
| *C09D 5/24* | (2006.01) |
| *C09K 11/02* | (2006.01) |
| *C09K 11/08* | (2006.01) |
| *H01L 29/06* | (2006.01) |
| *H01L 29/12* | (2006.01) |
| *H01L 33/50* | (2010.01) |
| *H01L 33/56* | (2010.01) |
| *H01B 1/20* | (2006.01) |
| *C08J 5/18* | (2006.01) |
| *B82Y 10/00* | (2011.01) |
| *H01L 29/22* | (2006.01) |
| *B82Y 20/00* | (2011.01) |

(52) U.S. Cl.
CPC ............... *C09C 3/12* (2013.01); *C09D 5/22* (2013.01); *C09D 5/24* (2013.01); *C09K 11/025* (2013.01); *C09K 11/08* (2013.01); *H01B 1/08* (2013.01); *H01B 1/10* (2013.01); *H01B 1/20* (2013.01); *H01L 29/0665* (2013.01); *H01L 29/127* (2013.01); *H01L 29/22* (2013.01); *H01L 33/501* (2013.01); *H01L 33/502* (2013.01); *H01L 33/507* (2013.01); *H01L 33/56* (2013.01); *B82Y 20/00* (2013.01); *H01L 33/504* (2013.01); *Y10S 977/774* (2013.01)

(58) Field of Classification Search
CPC ....... C09K 11/08; C09K 11/06; B22F 1/0059; B22F 1/0062; B22F 2001/0066; B82Y 10/00; B82Y 15/00; B82Y 20/00; H01L 29/127; H01L 33/501; H01L 33/502; H01L 33/504; H01L 33/507; H01L 33/52; H01L 33/56; H01L 29/122; H01L 29/22; H01L 29/0665; C09C 1/0081; C09C 3/12; C09C 2200/407; C09C 2200/408; C04B 20/1051; C04B 24/42; C04B 24/425; C08K 5/5415; C09D 5/22; C09D 5/24
See application file for complete search history.

(56) References Cited

U.S. PATENT DOCUMENTS

| | | | | |
|---|---|---|---|---|
| 7,393,469 | B2* | 7/2008 | Benrashid | G03F 7/0757 106/287.16 |
| 9,512,353 | B2* | 12/2016 | Kwon | H01L 33/501 |
| 2009/0085473 | A1* | 4/2009 | Ilzumi | B82Y 20/00 313/504 |
| 2010/0059743 | A1* | 3/2010 | Jun | B82Y 30/00 257/43 |
| 2010/0117110 | A1 | 5/2010 | Park et al. | |
| 2012/0025239 | A1* | 2/2012 | Kim, II | C07F 7/0854 257/98 |

FOREIGN PATENT DOCUMENTS

| | | | | |
|---|---|---|---|---|
| KR | 1020090024618 A | | 3/2009 | |
| KR | 1020100053409 A | | 5/2010 | |
| WO | 0245129 A2 | | 6/2002 | |
| WO | WO 2012078594 A1 * | | 6/2012 | ............ C08G 77/20 |

* cited by examiner

[FIG. 1]
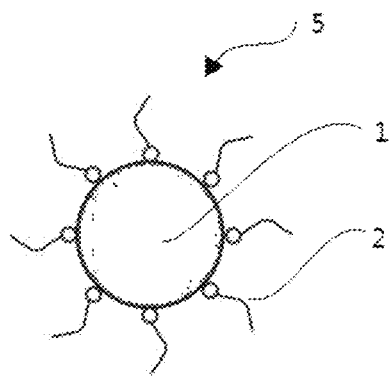
[FIG. 2]
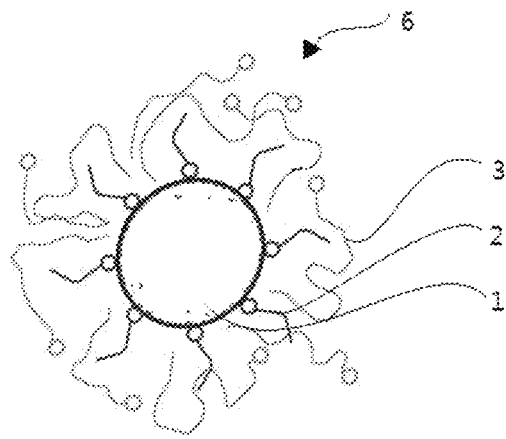

[FIG. 3]
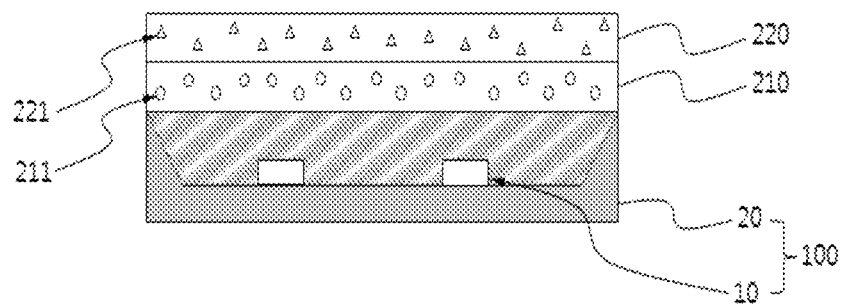
[FIG. 4]
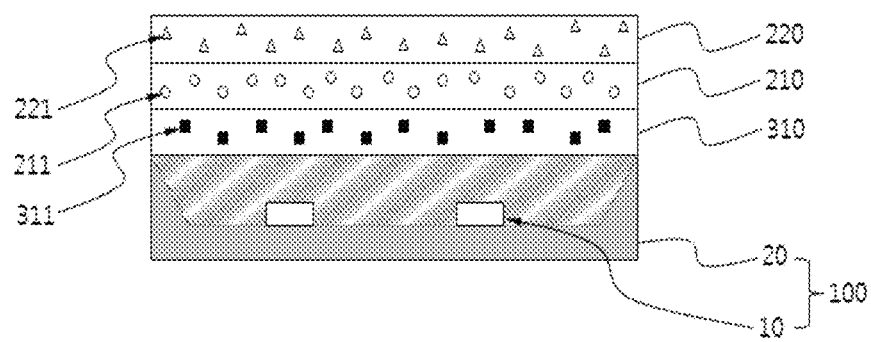
[FIG. 5]
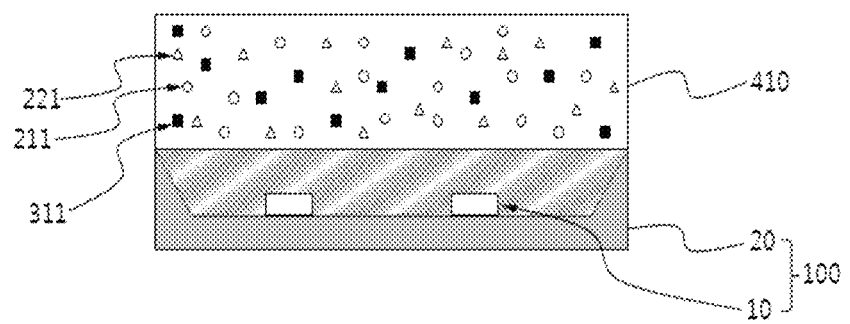

ENCAPSULATED QUANTUM DOTS AND DEVICE USING SAME

CROSS-REFERENCE TO RELATED APPLICATIONS

This application is the United States national phase of International Application No. PCT/KR2013/005887 filed Jul. 3, 2013, and claims priority to Korean Patent Application No. 10-2012-0072217 filed Jul. 3, 2012, the disclosures of which are hereby incorporated in their entirety by reference.

TECHNICAL FIELD

The present invention relates to an encapsulated quantum dot for enhancing characteristics of a quantum dot, and a device using the same.

BACKGROUND ART

A quantum dot is a material having a crystalline structure only a few nanometers in size, and is composed of about a few hundred atoms to about a few thousand atoms. Since the quantum dot is very small, a quantum confinement effect occurs therein. The quantum confinement effect refers to a phenomenon in which when an object is reduced to a nano size or less, an energy band gap of the object is increased. Accordingly, when light of a wavelength having energy higher than the energy band gap is incident onto the quantum dot, the quantum dot absorbs energy of the light so that an energy level of the quantum dot is excited into an excited state, and then the energy level of the quantum dot drops to a ground state while the quantum dot is emitting light having a specific wavelength. The wavelength of the emitted light is determined by energy corresponding to the band gap.

In general, the smaller the particle of a quantum dot is, the shorter the wavelength of light emitted is, and the larger the particle of the quantum dot is, the longer the wavelength of light emitted is. These are distinct electrical and optical properties different from those of existing semiconductor materials. Therefore, desired light emitting characteristics of the quantum dot may be implemented by controlling the size, composition and the like of the quantum dot.

DETAILED DESCRIPTION OF THE INVENTION

Technical Problem

The present invention has been made in an effort to provide an encapsulated quantum dot which may enhance dispersion stability and light emission characteristics.

The present invention has also been made in an effort to provide a composition including the quantum dot.

The present invention has also been made in an effort to provide a coating layer or film formed of the composition, and a device using the same.

Technical Solution

An exemplary embodiment of the present invention provides a quantum dot encapsulated by a siloxane-based compound including an alkyl group having 4 to 20 carbon atoms.

In an exemplary embodiment, the siloxane-based compound may have a structure of the following Formula 1.

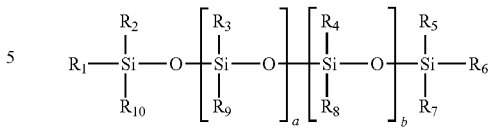

[Formula 1]

In Formula 1, at least one of $R_1$ to $R_{10}$ is an alkyl group having 4 to 20 carbon atoms, the others are each independently an alkyl group having 1 to 3 carbon atoms, or an aryl group having 6 to 18 carbon atoms, and a and b may be an integer which satisfies a ratio of 0.04 to 0.96:0.04 to 0.96 (a:b).

Another exemplary embodiment of the present invention provides a composition including the encapsulated quantum dot and a resin in which the quantum dot is dispersed.

Yet another exemplary embodiment of the present invention provides a coating layer or film formed of the composition, or a device using the same.

Advantageous Effects

The encapsulated quantum dot according to the present invention may be effectively applied to various types of devices due to excellent quantum yield and dispersion stability.

BRIEF DESCRIPTION OF DRAWINGS

FIG. 1 is a conceptual view for describing the structure of a general quantum dot.

FIG. 2 is a conceptual view for describing an encapsulated quantum dot according to an exemplary embodiment of the present invention.

FIGS. 3 to 5 are cross-sectional views for describing an LED device including layers formed of a composition according to an exemplary embodiment of the present invention.

BEST MODE

An encapsulated quantum dot according to the present invention is encapsulated by a siloxane-based compound including an alkyl group having 4 to 20 carbon atoms. Hereinafter, the structure of a general quantum dot will be simply described with reference to FIG. 1, and the present invention having a form in which the quantum dot is encapsulated will be described in detail with reference to FIG. 2.

FIG. 1 is a conceptual view for describing the structure of a general quantum dot.

Referring to FIG. 1, a quantum dot 5 generally includes a core particle 1 and a ligand 2 bonded to the surface of the core particle 1.

Examples of a material for forming the core particle 1 include a compound semiconductor nanocrystal of Group II-VI such as CdS, CdSe, CdTe, ZnS, ZnSe, ZnTe, HgS, HgSe, and HgTe, a compound semiconductor nanocrystal of Group III-V such as GaN, GaP, GaAs, InP, and InAs, or a mixture thereof, and the like. The core particle 1 may have a core/shell structure, and each of the core and the shell of the core particle 1 may include the exemplified compounds. The exemplified compounds may be each used either alone or in combination of two or more thereof and included in the core or shell. For example, the core particle 1 may have a CdSe—ZnS (core/shell) structure which includes a core including CdSe and a shell including ZnS.

The ligand 2 may prevent core particles 1 adjacent to each other from easily aggregating and being quenched. Further, the ligand 2 is bonded to the core particle 1 to allow the core particle 1 to be hydrophobic. Accordingly, when a quantum dot 5 including the core particle 1 and the ligand 2 is dispersed in a resin for forming a coating layer or film, dispersibility with respect to the resin may be enhanced compared to a quantum dot including only the core particle 1 without the ligand 2. Examples of the ligand 2 include an amine-based compound including an alkyl group having 6 to 30 carbon atoms, or a carboxylic acid compound. Other examples of the ligand 2 include an amine-based compound including an alkenyl group having 6 to 30 carbon atoms, or a carboxylic acid compound.

FIG. 2 is a conceptual view for describing an encapsulated quantum dot according to an exemplary embodiment of the present invention.

Referring to FIG. 2, an encapsulated quantum dot 6 according to the present invention further includes a capsule layer surrounding the quantum dot 5 illustrated in FIG. 1. The encapsulation in the present invention may be defined as the confinement of the quantum dot 5 in the capsule layer 3 by surrounding the circumference of the quantum dot 5 with the capsule layer 3.

The capsule layer 3 includes a siloxane-based compound including an alkyl group having 4 to 20 carbon atoms. The capsule layer 3 may be bonded to the core particle 1 or the ligand 2 by an attractive force, for example, van der Waals force.

Even though the resin for forming a coating layer or film includes a methyl group or a phenyl group to become more hydrophilic than the quantum dot 5, the capsule layer 3 of the encapsulated quantum dot 6 has high affinity for both the quantum dot 5 and the resin, and thus may be easily dispersed in a polymer matrix of the resin. The term "polymer matrix" may be defined as an internal structure of a cured material obtained by curing a curable resin used as the resin for forming a coating layer or film or a resulting product obtained by drying a thermoplastic resin.

As the encapsulated quantum dot 6 is stably dispersed in the resin, it is possible to prevent an aggregation phenomenon of quantum dots 6 adjacent to each other in a composition including the encapsulated quantum dot 6 and the resin. Accordingly, deterioration of the quantum yield may be minimized by preventing the encapsulated quantum dots 6 from being quenched.

When the number of carbon atoms of the alkyl group of the siloxane-based compound is less than 4, the degree that the quantum dot 5 is encapsulated by the capsule layer 3 is reduced, so that a problem in that the quantum dot 5 and the siloxane-based compound are separated occurs. In addition, when the number of carbon atoms of the alkyl group of the siloxane-based compound exceeds 20, a problem in that compatibility deteriorates, such as the occurrence of haze in the composition. Furthermore, when the number of carbon atoms of the alkyl group of the siloxane-based compound exceeds 20, it may be rather difficult for the capsule layer 3 to be formed. Therefore, the number of carbon atoms of the alkyl group is preferably 4 to 20. For example, the alkyl group may have 6 to 16 carbon atoms. In this case, the alkyl group of the siloxane-based compound may include both a liner-type alkyl group and a branched-type alkyl group.

The siloxane-based compound which constitutes the capsule layer 3 is a surface modifier of the quantum dot 5, and may not directly take part in a chemical reaction occurring during the process of curing the composition or processing the molding by using the composition.

The siloxane-based compound may have a structure such as a monomer, an oligomer, a polymer and a copolymer according to the weight average molecular weight thereof. Accordingly, in the process of encapsulating the quantum dot 5, the siloxane-based compound may be used in the form of a wax-type, a fluid-type, and the like. Hereinafter, the term "weight average molecular weight" will be defined as a weight average molecular weight in terms of polystyrene measured by gel permeation chromatography (GPC).

Hereinafter, examples of the siloxane-based compound will be specifically described through Formulae.

In an exemplary embodiment, the siloxane-based compound may include a structure of the following Formula 1.

[Formula 1]

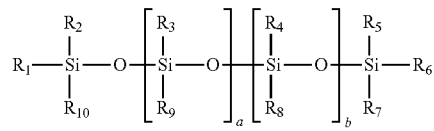

In Formula 1, at least one of $R_1$ to $R_{10}$ is an alkyl group having 4 to 20 carbon atoms, the others are each independently an alkyl group having 1 to 3 carbon atoms, or an aryl group having 6 to 18 carbon atoms, and a and b are an integer which satisfies a ratio of 0.04 to 0.96:0.04 to 0.96 (a:b).

As an example, in Formula 1, at least one of $R_1$ to $R_{10}$ is an alkyl group having 4 to 20 carbon atoms, and the others are each independently a methyl group or a phenyl group. In this case, a and b may satisfy a ratio of 0.2 to 0.96:0.04 to 0.8 (a:b), and for example, a and b may satisfy a ratio of 0.5 to 0.8:0.2 to 0.5, a ratio of 0.62 to 0.72:0.28 to 0.38, or a ratio of 0.65:0.35. The ratio of a and b may be defined as a molar ratio.

In another exemplary embodiment, the siloxane-based compound may include a structure of the following Formula 2.

[Formula 2]

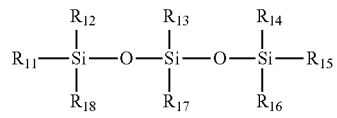

In Formula 2, at least one of $R_{11}$ to $R_{18}$ is an alkyl group having 4 to 20 carbon atoms, and the others are each independently an alkyl group having 1 to 3 carbon atoms, or an aryl group having 6 to 18 carbon atoms.

As an example, in Formula 2, at least one of $R_{11}$ to $R_{18}$ is an alkyl group having 4 to 20 carbon atoms, and the others may be each independently a methyl group or a phenyl group.

As another example, the siloxane-based compound may include a structure of the following Formula 3.

[Formula 3]

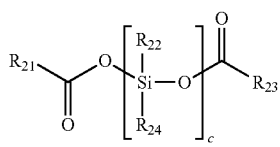

In Formula 3, at least one of $R_{21}$ to $R_{24}$ is an alkyl group having 4 to 20 carbon atoms, the others are each independently an alkyl group having 1 to 3 carbon atoms, or an aryl group having 6 to 18 carbon atoms, and c is an integer of 1 to 1,000.

For example, in Formula 3, at least one of $R_{21}$ to $R_{24}$ is an alkyl group having 4 to 20 carbon atoms, and the others may be each independently a methyl group or a phenyl group.

As another example, the siloxane-based compound may include a structure of the following Formula 4.

[Formula 4]

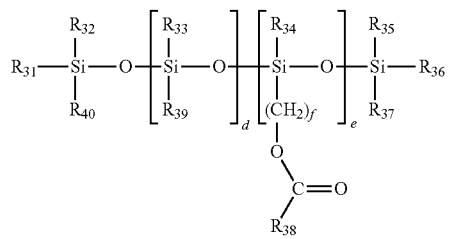

In Formula 4, at least one of $R_{31}$ to $R_{40}$ is an alkyl group having 4 to 20 carbon atoms, the others are each independently an alkyl group having 1 to 3 carbon atoms, or an aryl group having 6 to 18 carbon atoms, d an e are an integer which satisfies a ratio of 0.04 to 0.96:0.04 to 0.96 (d:e), and f is an integer of 1 to 100. The ratio of d and e may be defined as a molar ratio.

For example, in Formula 4, at least one of $R_{31}$ to $R_{40}$ is an alkyl group having 4 to 20 carbon atoms, and the others may be each independently a methyl group or a phenyl group.

In Formula 4, d and e may satisfy a ratio of 0.2 to 0.96:0.04 to 0.8 (d:e), and for example, may be an integer which satisfies 0.5 to 0.8:0.2 to 0.5, 0.62 to 0.72:0.28 to 0.38, or 0.65:0.35. In Formula 4, f is an integer of 1 to 100, and for example, may be an integer of 1 to 50. More specifically, in Formula 4, f may be an integer of 1 to 30.

As another example, the siloxane-based compound may include a structure of the following Formula 5.

[Formula 5]

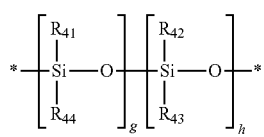

In Formula 5, at least one of $R_{41}$ to $R_{44}$ is an alkyl group having 4 to 20 carbon atoms, the others are each independently an alkyl group having 1 to 3 carbon atoms, or an aryl group having 6 to 18 carbon atoms, and g and h are an integer which satisfies the ratio of 0.04 to 0.96:0.04 to 0.96 (g:h). The ratio of g and h may be defined as a molar ratio.

For example, in Formula 5, at least one of $R_{41}$ to $R_{44}$ is an alkyl group having 4 to 20 carbon atoms, and the others may be each independently a methyl group or a phenyl group.

In Formula 5, g and h may satisfy a ratio of 0.2 to 0.96:0.04 to 0.8 (g:h), and for example, may be an integer which satisfies 0.5 to 0.8:0.2 to 0.5, 0.62 to 0.72:0.28 to 0.38, or 0.65:0.35.

In the siloxane-based compound, the compounds represented by Formulae 1 to 4 and the compound having the structure represented by Formula 5 may be used either alone or in combination of two or more thereof.

Further, as a more specific example, the siloxane-based compound may include one or more of the structures of the following Formulae 6 to 10.

[Formula 6]

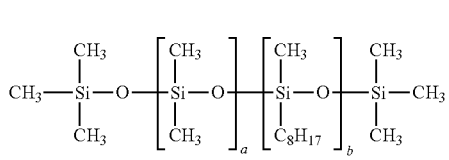

[Formula 7]

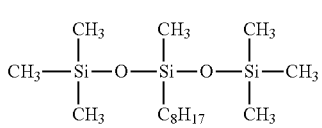

[Formula 8]

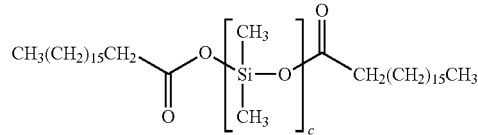

[Formula 9]

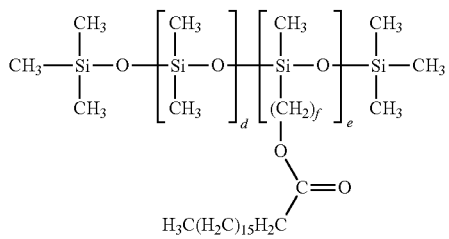

[Formula 10]

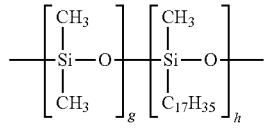

In Formula 6, a and b are an integer which satisfies a ratio of 0.04 to 0.96:0.04 to 0.96 (a:b), in Formula 8, c is an integer of 1 to 1,000, in Formula 9, d and e are an integer which satisfies a ratio of 0.04 to 0.96:0.04 to 0.96 (d:e) and f is an integer of 1 to 100, and in Formula 10, g and h may be an integer which satisfies a ratio of 0.04 to 0.96:0.04 to 0.96 (g:h).

The ratio of a and b, the ratio of d and e, and the ratio of g and h may be each independently 0.04 to 0.96:0.04 to 0.96, for example, 0.2 to 0.96:0.04 to 0.8, 0.5 to 0.8:0.2 to 0.5, 0.62 to 0.72:0.28 to 0.38, or 0.65:0.35.

The weight average molecular weight of the siloxane-based compound may be about 100 to about 100,000. For example, the weight average molecular weight of the siloxane-based compound may be about 300 to about 50,000. In contrast, the weight average molecular weight of the siloxane-based compound may be about 20,000 to about 30,000. When the weight average molecular weight of the siloxane-based compound is about 100 to about 100,000, the encapsulated quantum dot 6 may be stably dispersed in the resin, and the quantum yield may be enhanced. In addition, within the ranges, light transmittance, heat resistance, UV stability and the like of a coating film or film formed of the composition may be enhanced.

The encapsulated quantum dot 6 may exhibit a light emitting peak in a wavelength range of about 300 nm to about 800 nm. For example, the encapsulated quantum dot 6 may exhibit a light emitting peak in a wavelength range of about 440 nm to about 680 nm. The wavelength range of the light emitting peak exhibited by the encapsulated quantum dot 6 may be determined by characteristics of the quantum dot 5 itself.

As an example, the encapsulated quantum dot 6 may exhibit a light emitting peak at about 520 nm to about 570 nm, or a light emitting peak at about 620 nm to about 670 nm. In this case, the encapsulated quantum dot 6 may absorb blue light and emit green light and/or red light. In contrast, the encapsulated quantum dot 6 may have a light emitting peak at a wavelength of about 570 nm to about 620 nm. In this case, the encapsulated quantum dot 6 may absorb blue light and emit yellow light.

The encapsulated quantum dot 6 may be prepared by mixing the quantum dot 5 with the siloxane-based compound. Specifically, the encapsulated quantum dot 6 may be prepared by adding about 10 parts by weight to about 1,000 parts by weight of a siloxane-based compound including an alkyl group having 4 to 20 carbon atoms with respect to 100 parts by weight of the quantum dot 5 to a solution including the quantum dot 5 and a solvent in which the quantum dot 5 is dispersed, uniformly mixing the resulting mixture using a stirrer or a Vortex mixer, and then removing the solvent from the mixture of the siloxane-based compound and the solution using an evaporator. Examples of the solvent include toluene, ethanol, methanol, distilled water, and the like.

In the process of preparing the encapsulated quantum dot 6, about 10 parts by weight to about 1,000 parts by weight of the siloxane-based compound may be used with respect to 100 parts by weight of the quantum dot 5. When the siloxane-based compound is used within the content range, quantum yield and dispersion stability of the encapsulated quantum dot 6 may be enhanced. That is, within the aforementioned range, the capsule layer 3 is stably formed while surrounding the quantum dot 5, thereby enhancing preparation reliability of the encapsulated quantum dot 6.

The encapsulated quantum dot 6 may exhibit a quantum yield of about 50% to about 90%. Specifically, quantum yield of the encapsulated quantum dot 6 may be measured using an absolute quantum yield measuring apparatus C9920-02 equipment (product name, manufactured by Hamamatsu Corp., Japan). For example, a measurement sample for measuring the quantum yield of the encapsulated quantum dot 6 may have a concentration of an optical density (OD) value of about 0.1. The encapsulated quantum dot 6 has a quantum yield relatively higher than that of the quantum dot 5.

The encapsulated quantum dot 6 may exhibit a dispersion stability of about 0.1% to about 10%. The dispersion stability of the encapsulated quantum dot 6 may be measured using a transmittance measuring apparatus Cary-4000 (product name, manufactured by Varian Inc., USA). For example, a measurement sample for measuring the dispersion stability of the encapsulated quantum dot 6 may have a concentration of an optical density (OD) value of 0.1. After a measurement sample having an OD value of about 0.1 is prepared using the encapsulated quantum dot 6, the dispersion stability may be calculated by measuring a transmittance of the measurement sample immediately after dispersion, and comparing the transmittance with a transmittance measured after 1 month. Specifically, the term "transmittance immediately after dispersion" is a value (unit: %) obtained by calculating transmittances within a range of about 400 nm to about 700 nm, which is a visible light region, measured by a transmittance measuring apparatus immediately after the measurement sample is prepared, as an arithmetic average. Furthermore, the term "transmittance measured after 1 month" is a value (unit: %) obtained by calculating transmittances within a range of about 400 nm to about 700 nm, which is a visible light region, measured by a transmittance measuring apparatus at the time point when 1 month has elapsed by preparing the measurement sample, and then being left to stand at room temperature, as an arithmetic average. The term "dispersion stability" may be defined as a value (%) of difference between the transmittance (%) immediately after the quantum dot is dispersed and the transmittance (%) after 1 month. The higher the transmittance measured for the measurement sample after 1 month is, the smaller value the dispersion stability of the measurement sample has, and as the measurement sample measured after 1 month becomes turbid, the smaller the transmittance is, the larger value the dispersion stability of the measurement sample has. That is, a smaller value of the dispersion stability of the encapsulated quantum dot 6 means good dispersion stability. That is, it can be said that when the encapsulated quantum dot 6 according to the present invention has dispersion stability of about 10% or less, the dispersion stability is good.

Further, the present invention provides a composition including the encapsulated quantum dot 6. The composition according to the present invention includes the encapsulated quantum dot 6 and a resin for forming a polymer matrix, and the encapsulated quantum dot 6 is dispersed in the resin. The encapsulated quantum dot 6 is substantially the same as those described in FIGS. 1 and 2, and hence, the overlapping detailed description will be omitted.

The resin may include a curable resin or a thermoplastic resin. The resin may be a silicone-based resin. Examples of the curable resin include a vinyl siloxane-based compound or an epoxy silicone resin. Examples of the thermoplastic resin include polydimethylsiloxane (PDMS), thermoplastic silicone vulcanizate (TPSiV), thermoplastic silicone polycarbonate-urethane (TSPCU), and the like.

When the resin includes a curable resin, the composition may further include a crosslinking agent, a catalyst, a fluorescent substance, and the like.

For example, the composition may include about 0.001 part by weight to 10 parts by weight of the encapsulated quantum dot 6, about 5 parts by weight to about 60 parts by weight of the crosslinking agent, and about 0.01 part by weight to about 0.5 part by weight of the catalyst, with respect to 100 parts by weight of the curable resin.

In addition, the present invention provides a coating layer or film formed of the composition. The coating layer or film may be formed by curing or drying the composition. For example, the composition may be cured using light or heat, and when the composition is photocured, UV rays may be used. A method of forming the coating layer or film is not particularly limited.

The coating layer or film may be in a form in which the encapsulated quantum dot 6 is dispersed in a matrix structure which the resin forms. In the coating layer or film, it can also be considered that the capsule layer 3 is fused with the matrix structure, and the quantum dot 5 in the form illustrated in FIG. 1 is substantially present in the matrix structure.

Furthermore, the present invention provides a device including the coating layer or film. The device is not particularly limited in range, and may be, for example, a lighting device, or a display device.

Hereinafter, the present invention will be described in more detail with reference to FIGS. 3 to 5, but the scope of the present invention is not limited thereto.

FIGS. 3 to 5 are cross-sectional views for describing an LED device including layers formed of a composition according to an exemplary embodiment of the present invention.

The LED device illustrated in FIG. 3 includes a light emitting diode (LED) element unit 100, and a first cured material layer 210 and a second cured material layer 220 which are formed on the LED element unit 100 and each include an encapsulated quantum dot. The LED element unit 100 includes a base part 20 and an LED chip 10 formed in a groove part of the base part 20.

The first cured material layer 210 includes an encapsulated green quantum dot 211 dispersed in a matrix structure which a curable resin forms. Here, the term "matrix structure" may mean an internal structure of a cured material formed from a chemical reaction of a curable resin of a composition used to form the first cured material layer 210.

The second cured material layer 220 includes an encapsulated red quantum dot 221 dispersed in a matrix structure which the curable resin forms.

The encapsulated green quantum dot 211 may have a light emitting peak at about 520 nm to about 570 nm, which is a green wavelength region. Furthermore, the encapsulated red quantum dot 221 may have a light emitting peak at about 600 nm to about 680 nm, which is a red wavelength region. For example, the red wavelength region may be about 620 nm to about 670 nm.

Further, the LED chip 10 is an LED chip which generates blue light, and the blue light may have a wavelength of about 400 nm to about 480 nm. For example, the blue wavelength region may be about 400 nm to about 450 nm.

An LED device illustrated in FIG. 4 includes an LED element unit 100, a first cured material layer 210 and a second cured material layer 220 which are formed on the LED element unit 100 and each include quantum dots, and a fluorescent layer 310 including a fluorescent substance 311. The LED device is substantially the same as the LED device described in FIG. 3, except for the fluorescent layer 310. Therefore, the overlapping detailed description will be omitted.

The fluorescent layer 310 may compensate for the light emission of the encapsulated green quantum dot 211 of the first cured material layer 210 and the red quantum dot 221 of the second cured material layer 220. The fluorescent substance may have a light emitting peak at, for example, about 520 nm to about 570 nm which is a green region and/or about 600 nm to about 680 nm which is a red region.

An LED device illustrated in FIG. 5 includes an LED element unit 100, and a cured material layer 410 which are formed on the LED element unit 100 and includes both an encapsulated quantum dot and a fluorescent substance. The cured material layer 410 may include an encapsulated green quantum dot 211, an encapsulated red quantum dot 221, and a fluorescent substance 311, which are dispersed in a matrix structure which a curable resin forms.

Hereinafter, the encapsulated quantum dot according to the present invention, and a composition and a cured material, which include the same will be described in detail through Examples. The Examples and the like of the present invention are provided only for exemplifying the detailed description of the invention, and the scope of the rights is not limited thereby.

Example 1

As a siloxane, the siloxane-based compound represented by Formula 6 (a:b=0.65:0.35, weight average molecular weight 3,000) was used. As a quantum dot, a Cd-based red quantum dot Nanodot-HE-610 product (product name, manufactured by QD Solution Co., Ltd., Korea) was used. An encapsulated quantum dot according to Example 1 was prepared by mixing 100 parts by weight of the quantum dot and 100 parts by weight of the siloxane.

Example 2

An encapsulated quantum dot according to Example 2 was prepared in substantially the same manner as in Example 1, except that the siloxane-based compound (weight average molecular weight 334) represented by Formula 7 was used as the siloxane.

Example 3

An encapsulated quantum dot according to Example 3 was prepared in substantially the same manner as in Example 1, except that the siloxane-based compound (c=10, weight average molecular weight 1,266) represented by Formula 8 was used as the siloxane.

Example 4

An encapsulated quantum dot according to Example 4 was prepared in substantially the same manner as in Example 1, except that the siloxane-based compound (d:e=0.65:0.35, f=10, weight average molecular weight 7,000) represented by Formula 9 was used as the siloxane.

Example 5

An encapsulated quantum dot according to Example 5 was prepared in substantially the same manner as in Example 1, except that the siloxane-based compound (g:h=0.65:0.35, weight average molecular weight 50,000) represented by Formula 10 was used as the siloxane.

Comparative Example 1

As a quantum dot according to Comparative Example 1, an unencapsulated Nanodot-HE-610 product was prepared.

Comparative Example 2

An encapsulated quantum dot according to Comparative Example 2 was prepared by encapsulating the quantum dot by a siloxane represented by the following Formula 11.

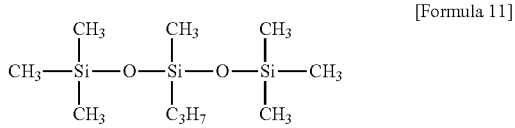

[Formula 11]

Comparative Example 3

An encapsulated quantum dot according to Comparative Example 3 was prepared by encapsulating the quantum dot by a siloxane represented by the following Formula 12.

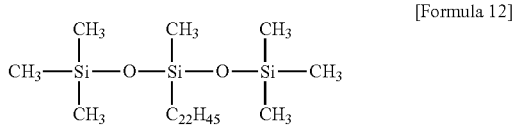

[Formula 12]

[Experimental Example-1]—Evaluation of Quantum Yield and Dispersion Stability

Measurement samples 1 to 5 and comparative samples 1 to 3 were prepared by mixing the encapsulated quantum dots according to Examples 1 to 5, the quantum dot according to Comparative Example 1, and the encapsulated quantum dots according to Comparative Examples 2 and 3, prepared as above with a vinyl siloxane resin OE-6630 (product name, manufactured by Dow Corning Corporation, USA) at a concentration of an optical density (OD) value of 0.1.

The quantum yield of each of measurement samples 1 to 5 and comparative samples 1 to 3 was measured using C9920-02 (product name, manufactured by Hamamatsu Corp., Japan) as an absolute quantum yield measuring apparatus. The results are shown in Table 1.

Further, the transmittance of each of measurement samples 1 to 5 and comparative samples 1 to 3 immediately after measurement samples 1 to 5 and comparative samples 1 to 3 were prepared was measured using a transmittance measuring apparatus Cary-4000 device (product name, manufactured by Varian Inc., USA). These transmittances were again measured after 1 month had elapsed, thereby calculating dispersion stability. The results are shown in Table 1.

TABLE 1

|  | Quantum yield (%) | Dispersion stability (%) |
| --- | --- | --- |
| Example 1 | 78.9 | 2.5 |
| Example 2 | 80.4 | 1.9 |
| Example 3 | 73.8 | 5.4 |
| Example 4 | 74.8 | 7.1 |
| Example 5 | 75.7 | 8.3 |
| Comparative Example 1 | 50.9 | 20.2 |
| Comparative Example 2 | 63.8 | 15.5 |
| Comparative Example 3 | 57.5 | 17.0 |

Referring to Table 1, it can be seen that the quantum yield of each of the encapsulated quantum dots according to Examples 1 to 5 has a value of 73.8% or more, and the quantum yield of each of the quantum dots according to Comparative Examples 1 to 3 has a value of 63.8% or less.

Through this, the encapsulated quantum dot according to the present invention has excellent quantum yield, and thus may be applied to an optical device which requires high luminance. Accordingly, luminance of the optical device may be enhanced.

Further, it can be seen that the dispersion stability of each of the encapsulated quantum dots according to Examples 1 to 5 has a value of 10% or less, whereas the dispersion stability of each of the quantum dots according to Comparative Examples 1 to 3 exceeds 10%. From the fact that a smaller value of the dispersion stability indicates excellent characteristics, it can be seen that the encapsulated quantum dots according to Examples 1 to 5 are relatively excellent in dispersion stability compared to the quantum dot or encapsulated quantum dots according to Comparative Examples 1 to 3. Therefore, the quantum dot according to the present invention is excellent in dispersion stability, and thus may be applied to various devices requiring stability.

[Experimental Example 2]—Evaluation of UV Stability and Heat Resistance

Samples 1 to 5 and comparative samples 1 to 3 in the form of a film were prepared by mixing each of the encapsulated quantum dots prepared according to Examples 1 to 5 of the present invention and the quantum dots or encapsulated quantum dots according to Comparative Examples 1 to 3 with OE-6630 (product name, manufactured by Dow Corning Corporation, USA) to prepare compositions, and then using each of the compositions.

UV stability was evaluated by measuring the first quantum yield (QYT1) of each of samples 1 to 5 and comparative samples 1 to 3, and measuring the second quantum yield (QYT2) of each of these samples at the time point when about 48 hours had passed after UV (365 nm) began to be irradiated thereon to calculate a difference between the first quantum yield and the second quantum yield ($\Delta QY=QYT1-QYT2$, unit: %). The results are shown in Table 2.

In addition, heat resistance was evaluated by measuring the first quantum yield (QYU1) of each of samples 1 to 5 and comparative samples 1 to 3, exposing these samples to about 90° C. for about 240 hours, and then measuring the second quantum yield (QYU2) of each of these samples to calculate a difference between the first quantum yield and the second quantum yield ($\Delta QY=QYU1-QYU2$, unit: %).

TABLE 2

|  | UV Stability ($\Delta Qy$, %) (UV irradiation, 48 hr) | Heat resistance ($\Delta Qy$, %) (90° C., 240 hr) |
| --- | --- | --- |
| Sample 1 | 6.0 | 6.2 |
| Sample 2 | 4.3 | 4.5 |
| Sample 3 | 11.0 | 11.0 |
| Sample 4 | 13.7 | 13.5 |
| Sample 5 | 10.0 | 9.8 |
| Comparative Sample 1 | 28.6 | 20.1 |
| Comparative Sample 2 | 35.0 | 28.5 |
| Comparative Sample 3 | 29.5 | 23.7 |

Referring to Table 2, it can be seen that in samples 1 to 5, $\Delta QY$ was not shown to exceed 14% in terms of UV stability. In contrast, it can be seen that in comparative samples 1 to 3, $\Delta QY$ was about 28% or more. Through this, it can be seen that a film prepared using a composition including the encapsulated quantum dot according to the present invention was relatively good in UV stability. That is, the film may be applied to various devices which require to be exposed to UV rays (internal light) generated from the LED itself for a long time and solar light (external light).

Furthermore, it can be seen that in samples 1 to 5, ΔQY did not exceed 14% in terms of heat resistance. In contrast, it can be seen that in comparative samples 1 to 3, ΔQY was 20% or more. Through this, a film prepared using a composition including the encapsulated quantum dot according to the present invention is excellent in heat resistance, and thus may maintain stable characteristics against high heat generated from a white LED when the film is applied to the LED.

EXPLANATION OF REFERENCE NUMERALS AND SYMBOLS

| | |
|---|---|
| 1: Core particle | 2: Ligand |
| 3: Capsule layer | 5: Quantum dot |
| 6: Encapsulated quantum dot | 10: LED chip |
| 20: Base part | 100: LED element unit |
| 210, 220, 410: Cured material layer | 211, 221: Encapsulated quantum dot |
| 310: Fluorescent layer | 311: Fluorescent substance |

The invention claimed is:

1. An encapsulated quantum dot comprising:
    a quantum dot including a core particle and a ligand bonded to the surface of the core particle; and
    a capsule layer including a siloxane-based compound and surrounding the quantum dot,
    wherein the siloxane-based compound includes an unsubstituted alkyl group having 4 to 20 carbon atoms,
    wherein the capsule layer is bonded to the core particle or the ligand by a van der Waals force,
    wherein a quantum yield is 50% to 90% at a concentration zone of an optical density (OD) value of 0.1,
    wherein a dispersion stability is 10% or less at a concentration zone of an optical density (OD) value of 0.1,
    wherein the siloxane-based compound is comprised in an amount of 10 parts by weight to 1,000 parts by weight with respect to 100 parts by weight of the quantum dot.

2. The encapsulated quantum dot of claim 1, wherein the siloxane-based compound comprises a structure of the following Formula 1:

[Formula 1]

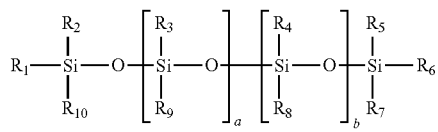

in Formula 1,
    at least one of $R_1$ to $R_{10}$ is an unsubstituted alkyl group having 4 to 20 carbon atoms, and the others are each independently an alkyl group having 1 to 3 carbon atoms, or an aryl group having 6 to 18 carbon atoms, and
    a and b are an integer which satisfies a ratio of 0.04 to 0.96:0.96 to 0.04 (a:b).

3. The encapsulated quantum dot of claim 1, wherein the siloxane-based compound comprises a structure of the following Formula 2:

[Formula 2]

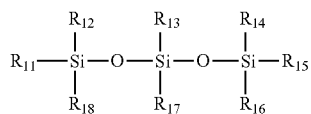

in Formula 2,
    at least one of $R_{11}$ to $R_{18}$ is an unsubstituted alkyl group having 4 to 20 carbon atoms, and the others are each independently an alkyl group having 1 to 3 carbon atoms, or an aryl group having 6 to 18 carbon atoms.

4. The encapsulated quantum dot of claim 1, wherein the siloxane-based compound comprises a structure of the following Formula 3:

[Formula 3]

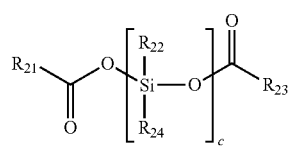

in Formula 3,
    at least one of $R_{21}$ to $R_{24}$ is an unsubstituted alkyl group having 4 to 20 carbon atoms, and the others are each independently an alkyl group having 1 to 3 carbon atoms, or an aryl group having 6 to 18 carbon atoms, and
    c is an integer of 1 to 1,000.

5. The encapsulated quantum dot of claim 1, wherein the siloxane-based compound comprises a structure of the following Formula 4:

[Formula 4]

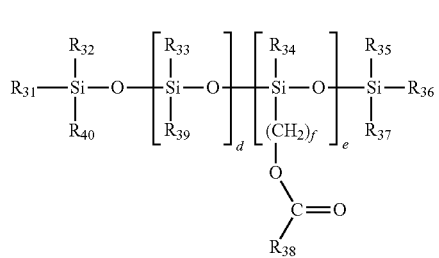

in Formula 4,
    at least one of $R_{31}$ to $R_{40}$ is an unsubstituted alkyl group having 4 to 20 carbon atoms, and the others are each independently an alkyl group having 1 to 3 carbon atoms, or an aryl group having 6 to 18 carbon atoms,
    d and e are an integer which satisfies a ratio of 0.04 to 0.96:0.04 to 0.96 (d:e), and
    f is an integer of 1 to 100.

6. The encapsulated quantum dot of claim 1, wherein the siloxane-based compound comprises a structure of the following Formula 5:

[Formula 5]

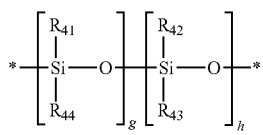

in Formula 5, at least one of $R_{41}$ to $R_{44}$ is an unsubstituted alkyl group having 4 to 20 carbon atoms, and the others are each independently an alkyl group having 1 to 3 carbon atoms, or an aryl group having 6 to 18 carbon atoms, and g and h are an integer which satisfies a ratio of 0.04 to 0.96:0.96 to 0.04 (g:h).

7. The encapsulated quantum dot of claim 1, wherein the siloxane-based compound comprises at least one of the structures of the following Formulae 6 to 10:

[Formula 6]

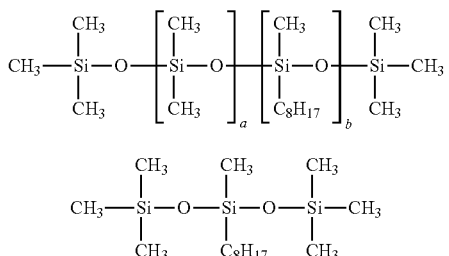

[Formula 7]

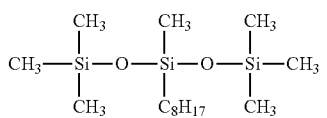

[Formula 8]

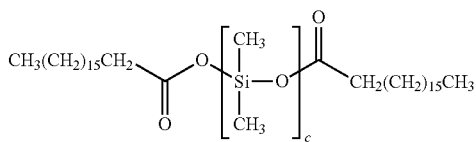

[Formula 9]

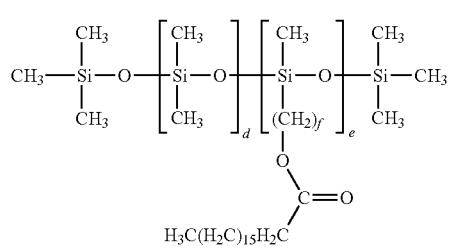

[Formula 10]

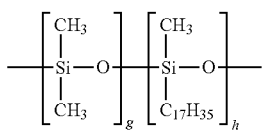

in Formula 6, a and b are an integer which satisfies a ratio of 0.04 to 0.96:0.96 to 0.04 (a:b), in Formula 8, c is an integer of 1 to 1,000, in Formula 9, d and e are an integer which satisfies a ratio of 0.04 to 0.96:0.96 to 0.04 (d:e) and f is an integer of 1 to 100, and in Formula 10, g and h are an integer which satisfies a ratio of 0.04 to 0.96:0.96 to 0.04 (g:h).

8. The encapsulated quantum dot of claim 1, wherein the siloxane-based compound has a weight average molecular weight of 100 to 50,000.

9. The encapsulated quantum dot of claim 1, wherein the quantum dot has a light emitting peak at a wavelength of 300 nm to 800 nm.

10. A composition comprising: the encapsulated quantum dot of claim 1; and resin in which the quantum dot is dispersed.

11. A coating layer comprising the composition of claim 10.

12. A film comprising the composition of claim 10.

13. A device comprising a coating layer or film comprising the composition of claim 10.

14. The device of claim 13, wherein the device is a lighting device, or a display device.

* * * * *